(12) United States Patent
Zi et al.

(10) Patent No.: US 11,137,685 B2
(45) Date of Patent: Oct. 5, 2021

(54) SEMICONDUCTOR METHOD OF PROTECTING WAFER FROM BEVEL CONTAMINATION

(71) Applicant: Taiwan Semiconductor Manufacturing Co., Ltd., Hsin-Chu (TW)

(72) Inventors: An-Ren Zi, Hsinchu (TW); Joy Cheng, Taoyuan (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/858,846

(22) Filed: Apr. 27, 2020

(65) Prior Publication Data

US 2020/0257203 A1   Aug. 13, 2020

Related U.S. Application Data

(63) Continuation of application No. 16/126,033, filed on Sep. 10, 2018, now Pat. No. 10,635,000, which is a continuation of application No. 15/685,908, filed on Aug. 24, 2017, now Pat. No. 10,073,347.

(51) Int. Cl.
| | | |
|---|---|---|
| *G03F 7/20* | (2006.01) | |
| *H01L 21/027* | (2006.01) | |
| *H01L 21/02* | (2006.01) | |
| *G03F 7/16* | (2006.01) | |
| *H01L 21/67* | (2006.01) | |
| *G03F 7/039* | (2006.01) | |

(Continued)

(52) U.S. Cl.
CPC .......... *G03F 7/2028* (2013.01); *G03F 7/0392* (2013.01); *G03F 7/162* (2013.01); *G03F 7/38* (2013.01); *G03F 7/40* (2013.01); *H01L 21/0274* (2013.01); *H01L 21/02282* (2013.01); *H01L 21/6715* (2013.01)

(58) Field of Classification Search
CPC ... G03F 7/2028; G03F 7/162; H01L 21/0274; H01L 21/6715; H01L 21/02282
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |

(Continued)

FOREIGN PATENT DOCUMENTS

| | | |
|---|---|---|
| KR | 20110065029 | 6/2011 |
| KR | 20130022911 | 3/2013 |
| KR | 20160086631 | 7/2016 |

*Primary Examiner* — Selim U Ahmed
*Assistant Examiner* — Evan G Clinton
(74) *Attorney, Agent, or Firm* — Haynes and Boone, LLP

(57) ABSTRACT

The present disclosure provides a method that includes coating an edge portion of a wafer by a first chemical solution including a chemical mixture of an acid-labile group, a solubility control unit and a thermal acid generator; curing the first chemical solution to form a first protecting layer on the edge portion of the wafer; coating a resist layer on a front surface of the wafer; removing the first protecting layer by a first removing solution; and performing an exposing process to the resist layer.

20 Claims, 17 Drawing Sheets

(51) Int. Cl.
  *G03F 7/38* (2006.01)
  *G03F 7/40* (2006.01)

(56) References Cited

U.S. PATENT DOCUMENTS

| | | |
|---|---|---|
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,711,367 B1 * | 7/2017 | Chien ................. H01L 21/0271 |
| 2008/0003830 A1 * | 1/2008 | Qing ................. H01L 21/31144 |
| | | 438/694 |
| 2009/0092931 A1 * | 4/2009 | Kang ................. G03F 7/70466 |
| | | 430/323 |

* cited by examiner

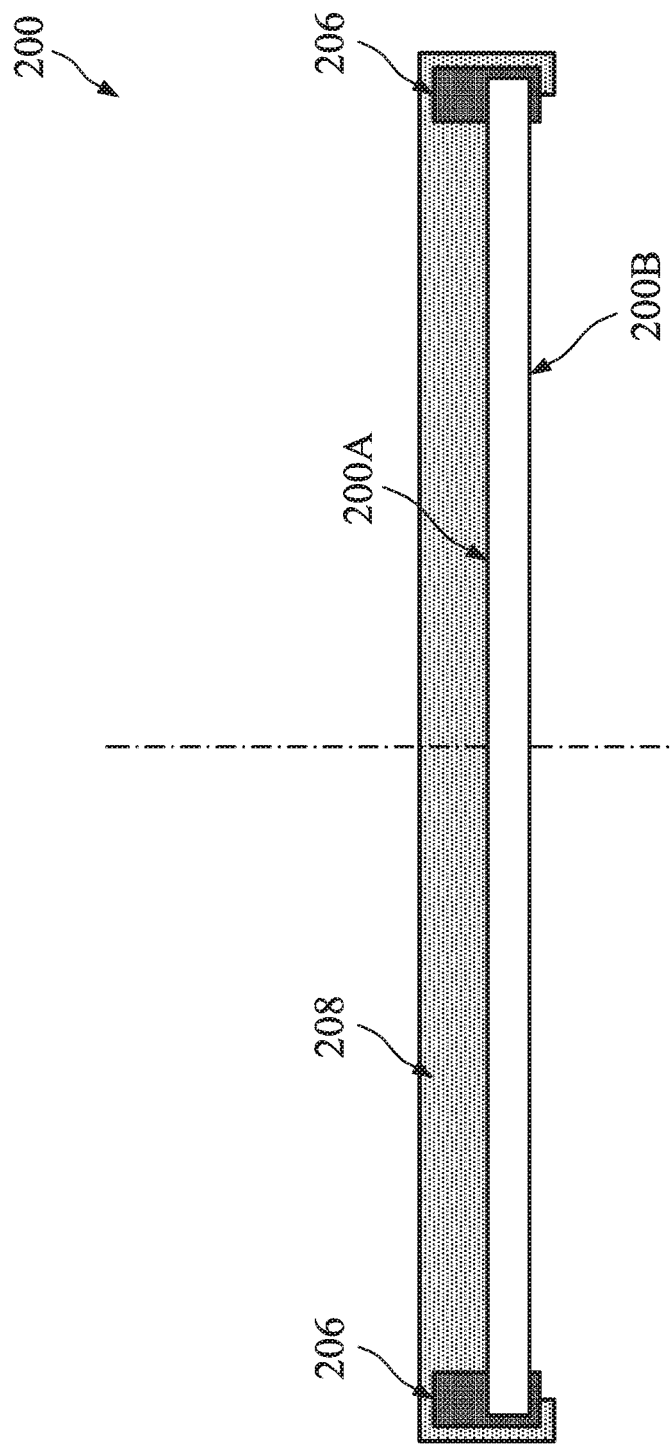

SEMICONDUCTOR METHOD OF PROTECTING WAFER FROM BEVEL CONTAMINATION

This application is a continuation of U.S. patent application Ser. No. 16/126,033, filed Sep. 10, 2018, which is a continuation of U.S. patent application Ser. No. 15/685,908, filed Aug. 24, 2017, the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, advanced lithography patterning technologies are implemented to form various patterns, such as gate electrodes and metal lines, on semiconductor wafers. A lithography patterning technology includes coating a resist material on the surface of a semiconductor wafer.

The existing resist coating method, such as spin coating, forms the resist material on all regions of a wafer including edges of the wafer, even to the backside surface of the wafer. The resist material on the edges and the backside surface of the wafer during the coating process and subsequent processes (such as developing) leads to various contamination-related problems and concerns, such as contaminating the coater chuck or the track. Accumulation of the resist material on the edges of the wafer will disturb patterning stability on the wafer edge and causes erroneous leveling readings during the lithography process. For examples, the presence of the resist material on the bevel and backside not only increases the probability of high hotspot but also has the potential to contaminate subsequent processing tools. In other examples, existing coating process has high resist residual at wafer edges and bevel, which may induce resist peeling and result in poor yield. Various methods are used or proposed to address the issues, such as edge bead rinse, backside rinse and additional coating. However, the undesired hump was created by edge bead rinse and backside rinse, which is potential defect source in the following processes. In other cases, the additional coating further introduces contaminations to wafers and lithography system or has additional efficiency and effectiveness concerns to manufacturing throughput. Accordingly, it may be desirable to provide a system and a method of utilizing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussions.

FIGS. 3A, 3B and 3C are sectional views of the wafer at a fabrication stage, constructed in accordance with various embodiments.

DETAILED DESCRIPTION

Figure 1:
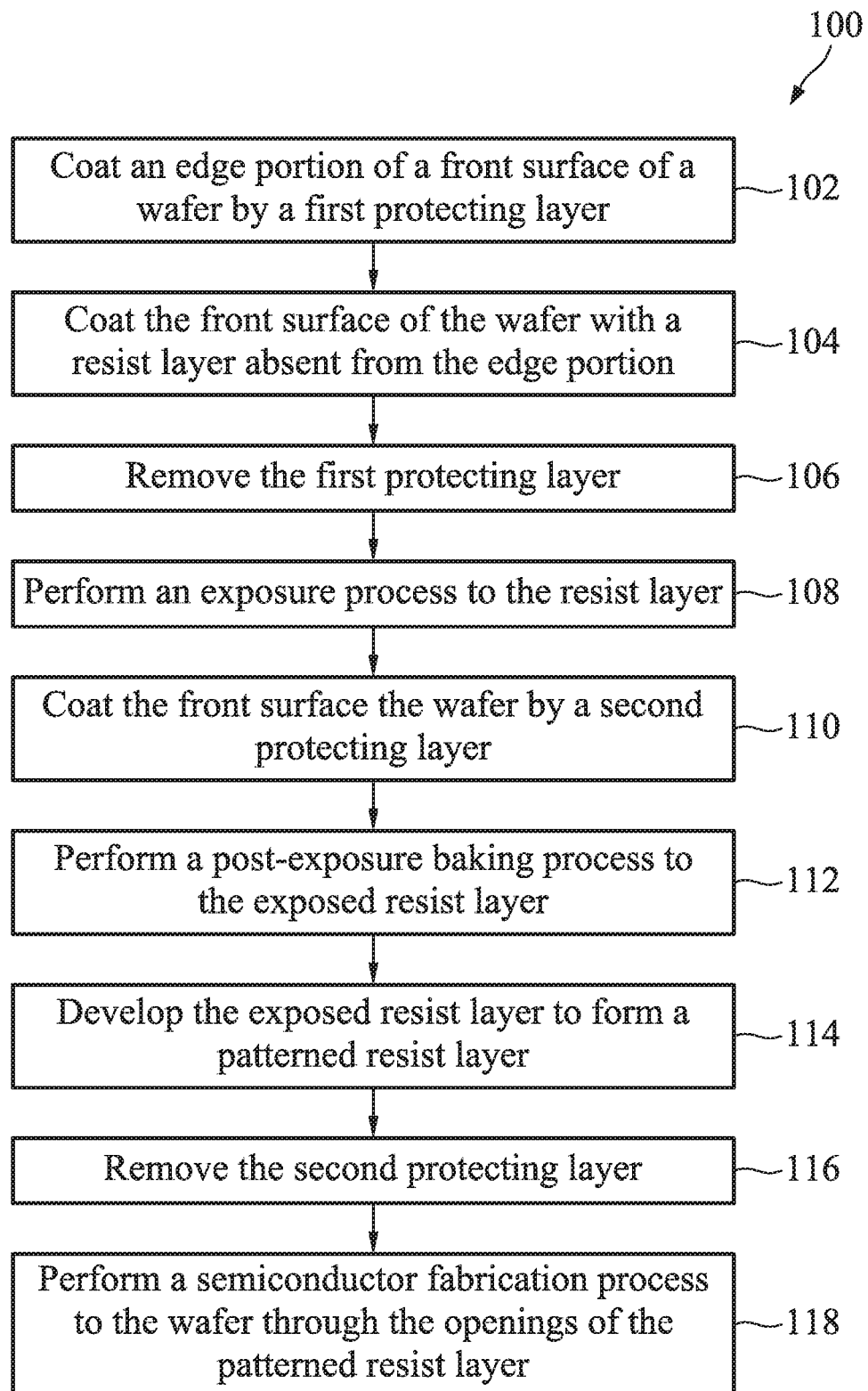
FIG. 1 is a flowchart of a method for integrated circuit fabrication, constructed in accordance with some embodiments.
Figure 2A:
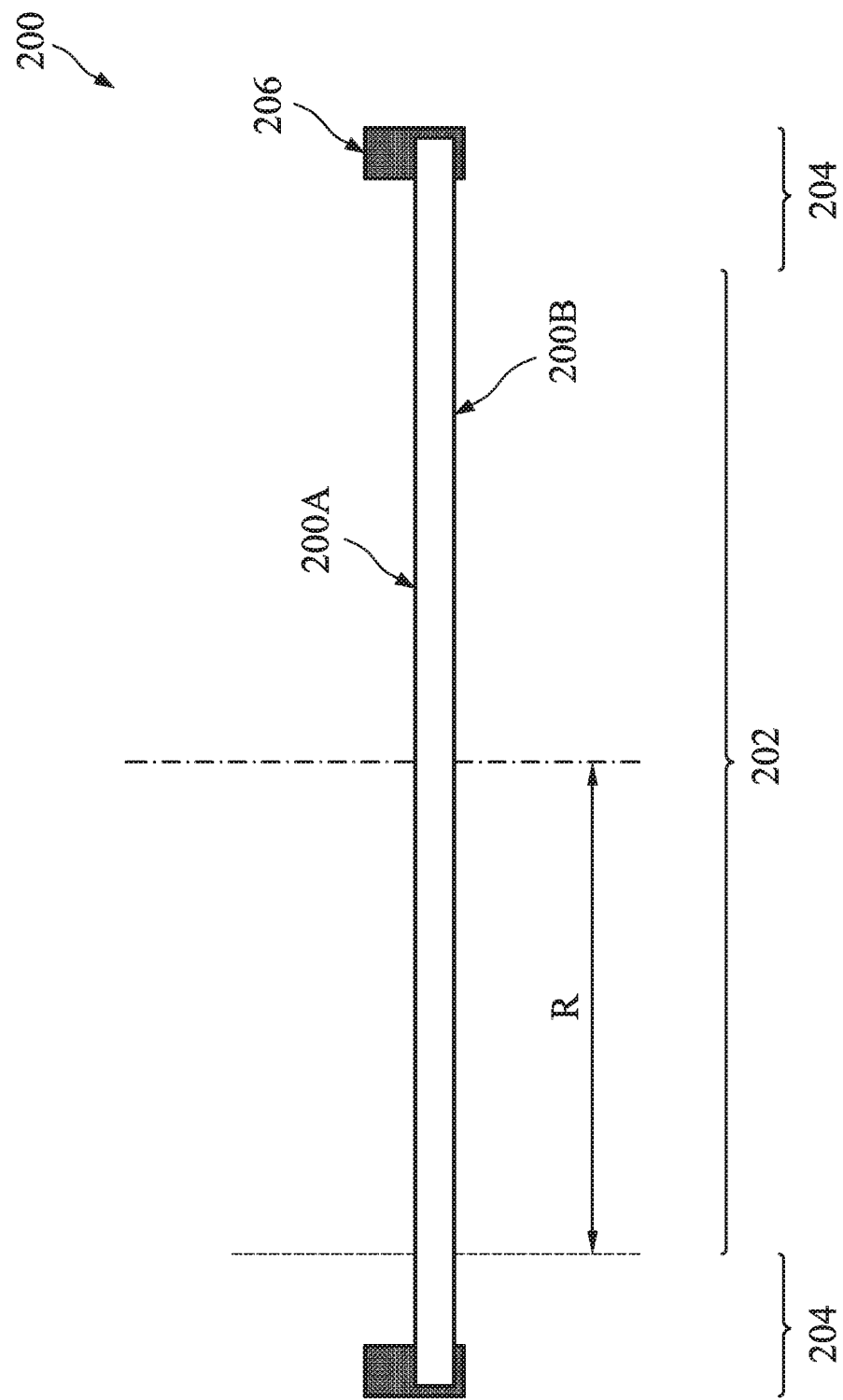
FIG. 2A is a sectional view of a wafer constructed in accordance with some embodiments.
Figure 2B:
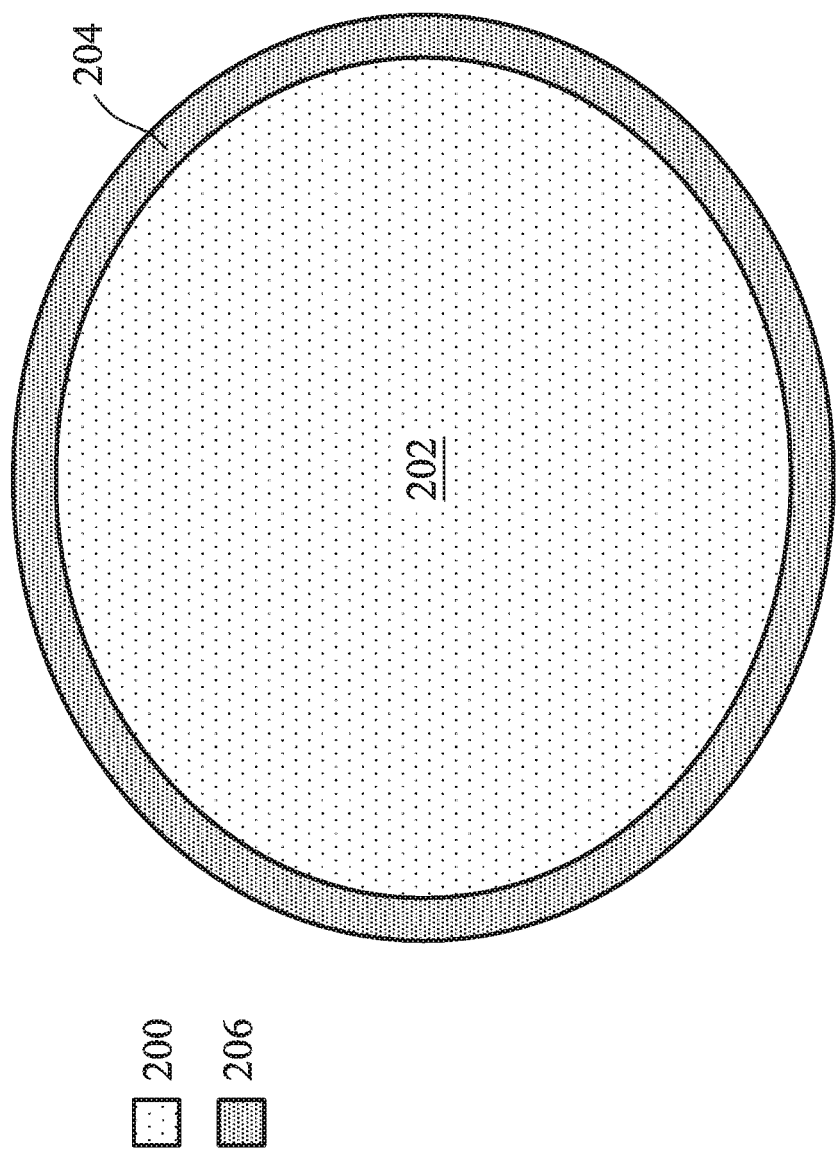
FIG. 2B is a top view of the wafer in FIG. 1, constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 illustrates a flowchart of a method 100 for integrated circuit fabrication in accordance with some embodiments. FIGS. 2A, 2B, 3A, 3B, 3C, 4, 7, 8, and 10-14 illustrate sectional and top views of a wafer 200 at various fabrication stages in accordance with some embodiments. The method 100, the wafer 200 and systems utilized in the method are collectively described with reference to those and other figures.

The method 100 includes an operation 102 to coat an edge portion of the wafer 200. In the present embodiment, the wafer 200 is a semiconductor wafer, such as a silicon wafer. In some embodiments, the wafer 200 may include other elementary semiconductor (such as germanium); a compound semiconductor (such as silicon germanium, silicon carbide, gallium arsenic, gallium phosphide, indium phosphide, indium arsenide, and/or indium antimonide); or combinations thereof. In furtherance of the embodiments, those semiconductor material films may be epitaxially grown on the silicon wafer. In some other embodiments, the wafer 200 may be a substrate of other material.

The wafer 200 has a front surface 200A and a backside surface 200B opposing from each other. One or more integrated circuits are formed, partially formed or to-be formed on the front surface 200A of the wafer 200. Therefore, the front surface 200A of the wafer 200 includes a patterned material layer or a material layer to be patterned. For examples, the front surface 200A may include various isolation features (such as shallow trench isolation features), various doped features (such as doped wells, or doped source and drain features), various devices (such as transistors, diodes, imaging sensors, or resistors), various conductive features (such as contacts, metal lines and/or vias of an interconnection structure), packaging material layers (such as bonding pads and/or a passivation layer), or a combination thereof. On a completely fabricated semiconductor wafer, all above material layers and patterns may present on the front surface 200A of the semiconductor wafer 200. In the present example, the semiconductor wafer 200 is still in the fabrication, a subset of the above material layers may be formed on the front surface 200A.

Figure 3A:
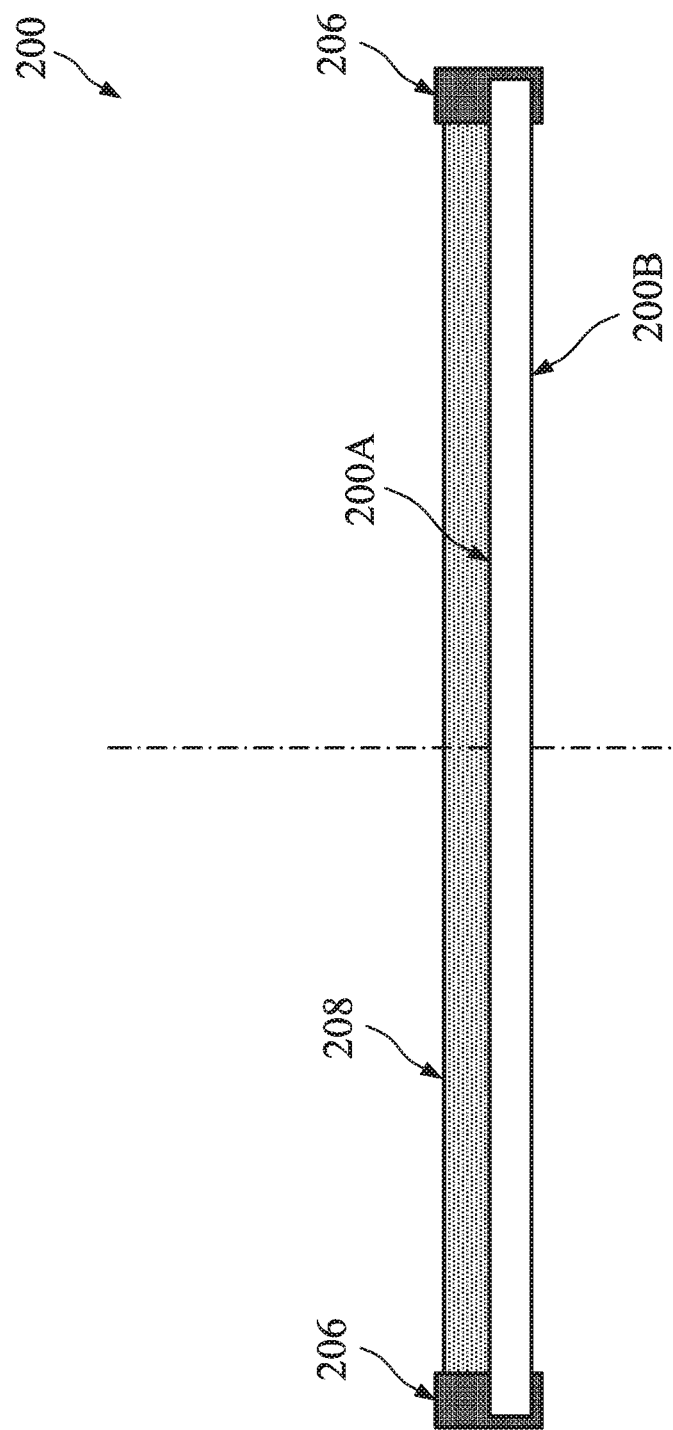

The wafer 200, such as a top material layer on the wafer or a silicon substrate of the wafer, is to be patterned through a lithography process. The wafer 200 includes a circuit region 202 and edge portion 204 surrounding the circuit region 202. The circuit region 202 is a region of the wafer 200 within which the integrated circuits are formed on the top surface 200A of the wafer. The circuit region 202 includes multiple integrated circuits that will be cut to form multiple integrated circuit chips at the backend of the fabrication. The circuit region 202 also includes scribing lines between the integrated circuit chips. Various test patterns may be formed in the scribing lines for various testing, monitoring and fabrication purposes. The edge portion 204 of the wafer 200 is a region without circuit and is not to be patterned during the fabrication. The edge portion 204 includes the portion at the edge of the front surface 200A, and may further include the bezel surface and the edge portion of the backside surface 200B of the wafer. In the operation 102, the edge portion 204 is coated with a protecting layer (or first protecting layer) 206, as illustrated in FIG. 3A, that constrains the edge portion 204 from direct deposition and formation of resist material thereon. The coating of the edge portion 204 of the wafer 200 may be implemented through a suitable mechanism in accordance to various embodiments.

Figure 4:
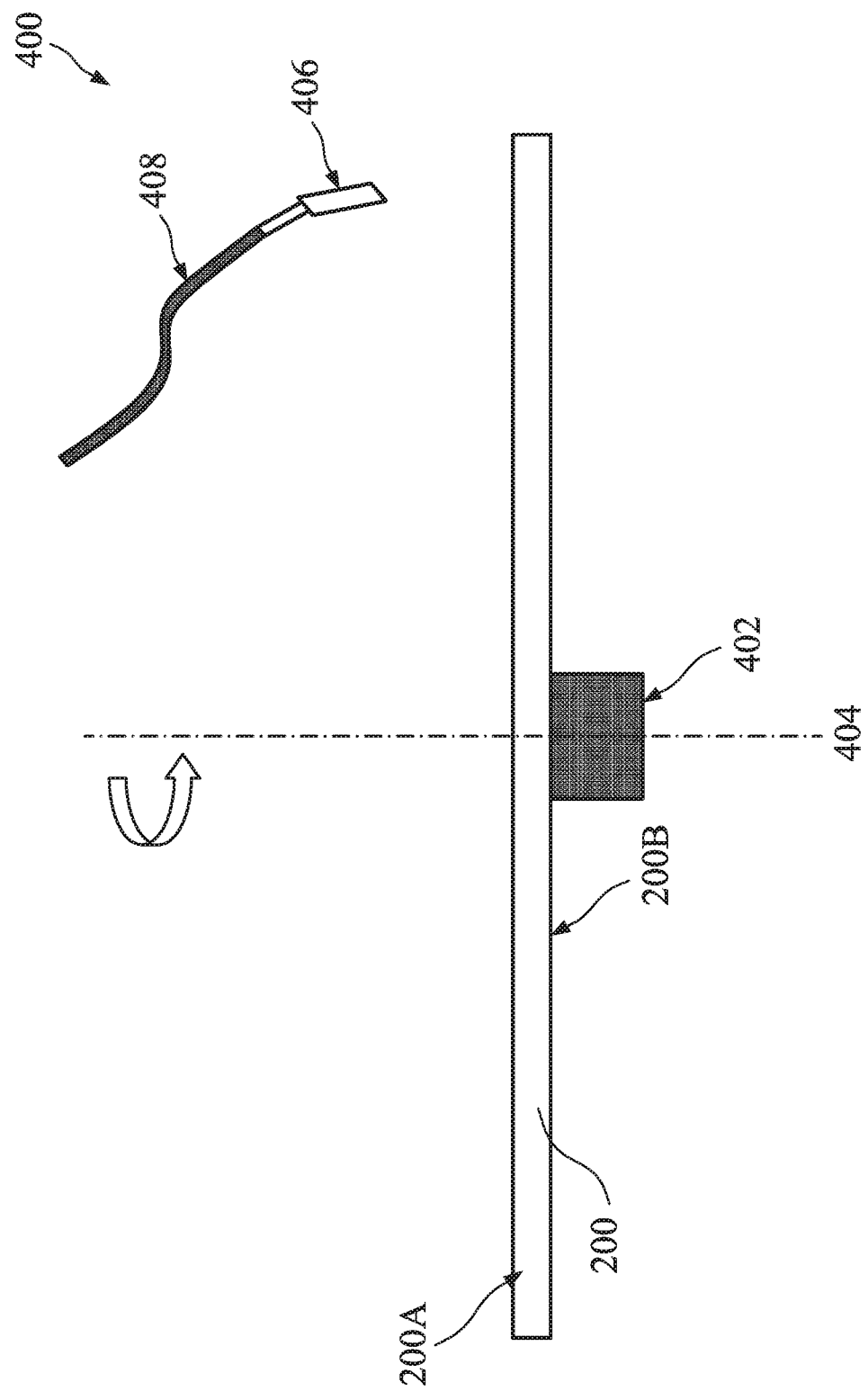
FIG. 4 is a schematic and sectional view of the wafer and a coating apparatus used by the method in FIG. 1, constructed in accordance with some embodiments.

The edge portion 204 is selectively coated to form a protecting layer 206 on the edge portion 204 of the wafer 200. The protecting layer 206 is formed to prevent various contaminations caused by the resist layer coated on the edge portion of the wafer. Those issues include peeling, leveling and contaminations (especially metal contaminations from the resist used in EUV lithography process). In some embodiments, the selective coating process includes spray coating to form the protecting layer 206 on the edge portion 204 of the wafer 200. Particularly, the spray coating process may utilize a spray coating apparatus 400 as illustrated in FIG. 4. The spray coating apparatus 400 includes a wafer stage 402 designed to secure the wafer 200 for spray coating. The wafer stage 402 is operable to rotate around the axis 404 such that the wafer 200 secured thereon spins as well. The spray coating apparatus 400 also includes a spray tip 406 designed to spray a protecting chemical solution, such as polymeric solution from a chemical supplier 408 connected to the spray tip. The spray tip 406 is configured to aim at the edge portion 206 of the wafer 200 and is able to spray the chemical solution thereto. The operation 102 includes spraying the chemical solution to the edge portion 204 of the wafer 200 and simultaneously spinning the wafer 200 such that the chemical solution is spun coated on the edge portion 204. In some examples, the protecting layer 206 has a thickness ranging between 500 angstroms and 1000 angstroms.

In the present embodiment, the chemical solution to be coated on the edge portion 204 of the wafer 200 includes a chemical mixture of an acid-labile group (ALG), a solubility control unit and a thermal acid generator (TAG). The chemical solution further includes proper solvent, such as organic solvent or aqueous solvent. A thermal process with a proper baking temperature will trig the TAG to release acid; the generated acid further reacts with the ALG; which leads to form a polymer material layer as the protecting layer. In the present example, the solubility control unit chemically binds with ALG, triggered by the generated acid, to form the cross-linked polymer material layer. In other examples, the chemical solution may further include other monomers. In this case, the ALG is initially chemically bonded to the monomer. The generated acid reacts with the ALG, causing the ALG cleaved from the monomer and the monomer to bind with the solubility control unit to form polymer. The chemical solution is sensitive to the thermal process but is free of photosensitive composition and is different from the resist.

Figure 5:
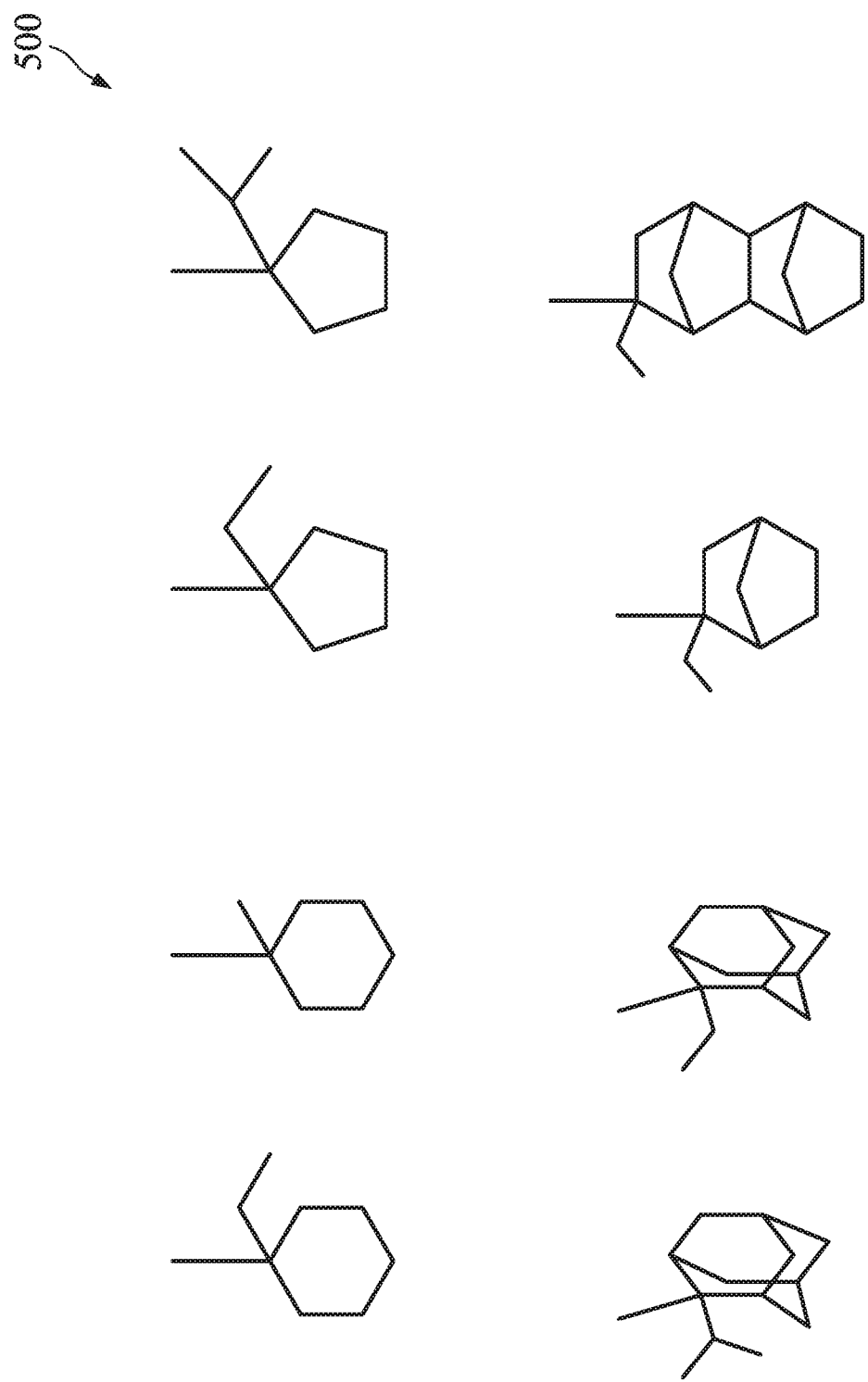
FIG. 5 illustrates a chemical structure of the ALG in the protecting layer of FIGS. 3A, 3B and 3C in accordance with various embodiments.
Figure 6:
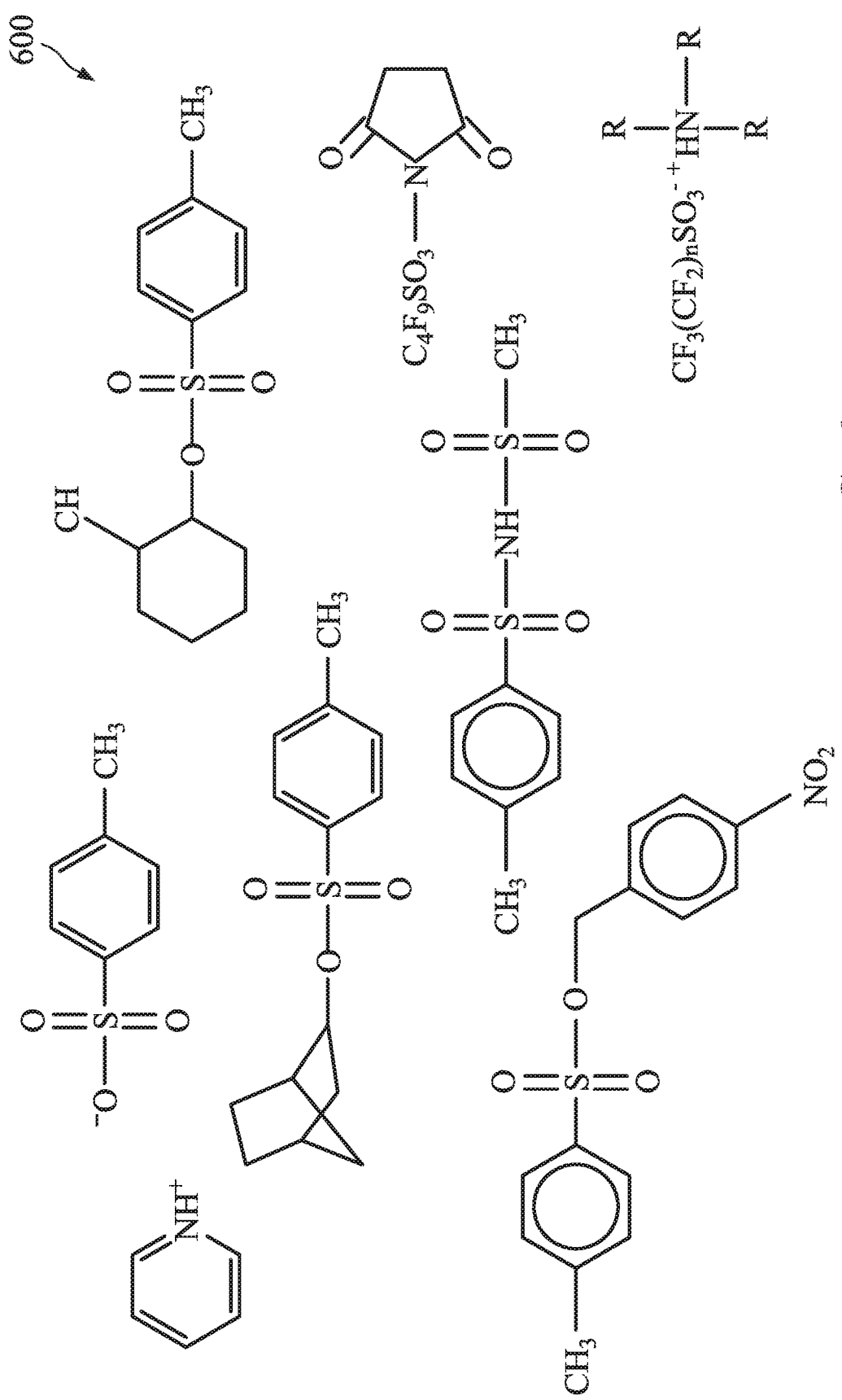
FIG. 6 illustrates a chemical structure of the TAG in the protecting layer of FIGS. 3A, 3B and 3C in accordance with various embodiments.

In some embodiments, the ALG includes a t-butoxycardbonyl (tBOC). FIG. 5 provides other examples of the ALG 500 in accordance with other embodiments. Carbon and hydrogen are not labeled in the above formulas according to convention. In some embodiments, the TAG is chosen from $NH_4^+C_4F_9SO_3^-$ and $NH_4^+CF_3SO_3^-$. FIG. 6 provides other examples of the TAG 600 in accordance with other embodiments. Carbon and hydrogen are not labeled in the above formulas according to convention. In some embodiments, the solubility control unit is chosen from chosen from lactone, ester, ether, ketone and a combination thereof.

The ALG, solubility control unit and TAG in the chemical solution are mixed in certain ratio. The total weight $W_0$ of the ALG and the solubility control unit in the chemical solution is used as reference. The weight of the ALG over the total weight $W_0$ ranges between 30% and 70%. The weight of the solubility control unit over the total weight $W_0$ ranges between 70% and 30%. The weight of the TAG over the total weight $W_0$ ranges between 3% and 20%.

The solubility control unit is designed to control the solubility of the protecting layer in a particular removal chemical. Thus, the protecting layer can be selectively removed by this particular removal chemical while the resist layer is able to remain. In other words, this particular removal chemical is able to dissolve the chemical groups of the protecting layer 206 corresponding to the solubility control units, and therefore is able to dissolve the protecting layer. Since the resist layer is free of the solubility control unit, the resist layer remains in the removal chemical. In the present embodiment, this particular removal chemical is a chemical solution (or removing solution) having a mixture of propylene glycol methyl ether (PGME) and propylene glycol methyl ether acetate (PGMEA). In furtherance of the present embodiment, the removing solution includes 70% PGME and 30% PGMEA, therefore also referred to OK73.

The operation 102 further includes a curing process to cure the protecting chemical solution to form the protecting layer 206, such as curing at elevated temperature or by ultraviolet irradiation, causing the coated chemical solution to cross-link to form a polymer material as the protecting layer 206 at the edge portion 204 as described earlier. In some embodiments, the curing process is a thermal baking process with a baking temperature higher enough to trig the TAG to release acid. In this consideration, the TAG is chosen such that the baking temperature in the thermal curing process is close to the temperature $T_{PEB}$ of the post-exposure baking, such as $T_{PEB} \pm 20°$ C. such as in a range between 130° C. and 170° C. The thermal curing process may have duration of about 60 second.

Figure 7:
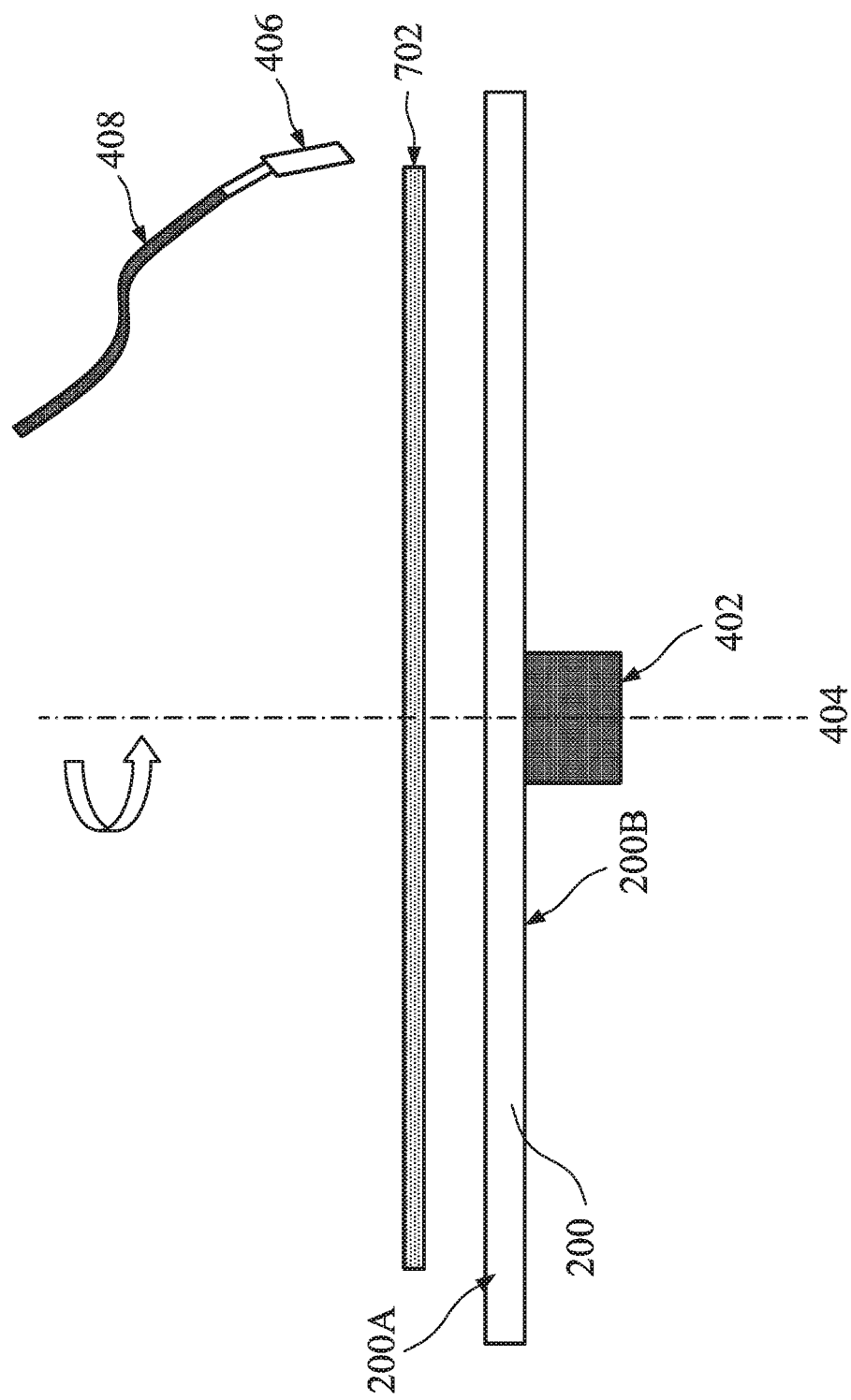
FIG. 7 is a schematic and sectional view of the wafer and a coating apparatus used by the method in FIG. 1, constructed in accordance with some embodiments.
Figure 8:
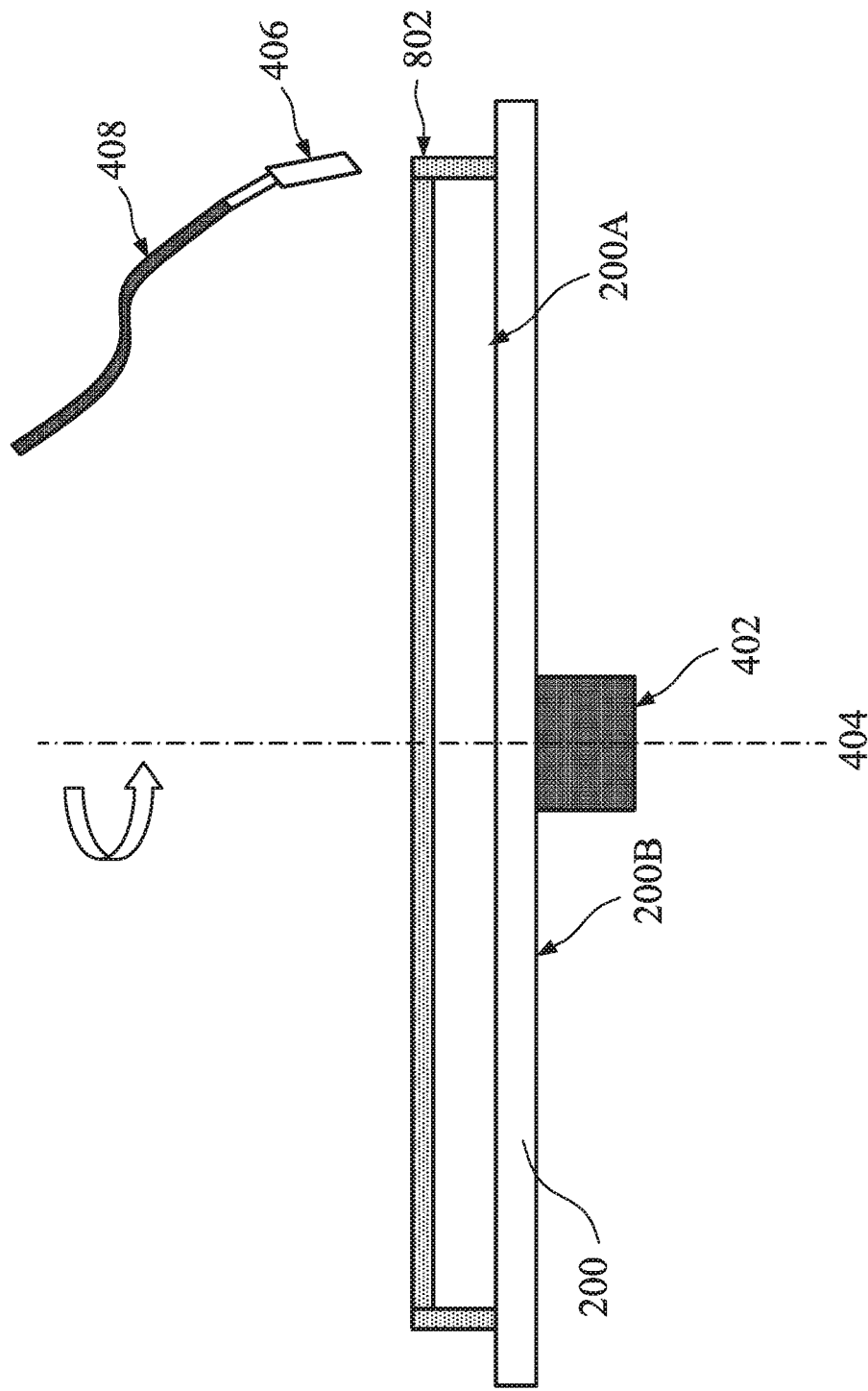
FIG. 8 is a schematic and sectional view of the wafer and a coating apparatus used by the method in FIG. 1, constructed in accordance with some embodiments.
Figure 9:
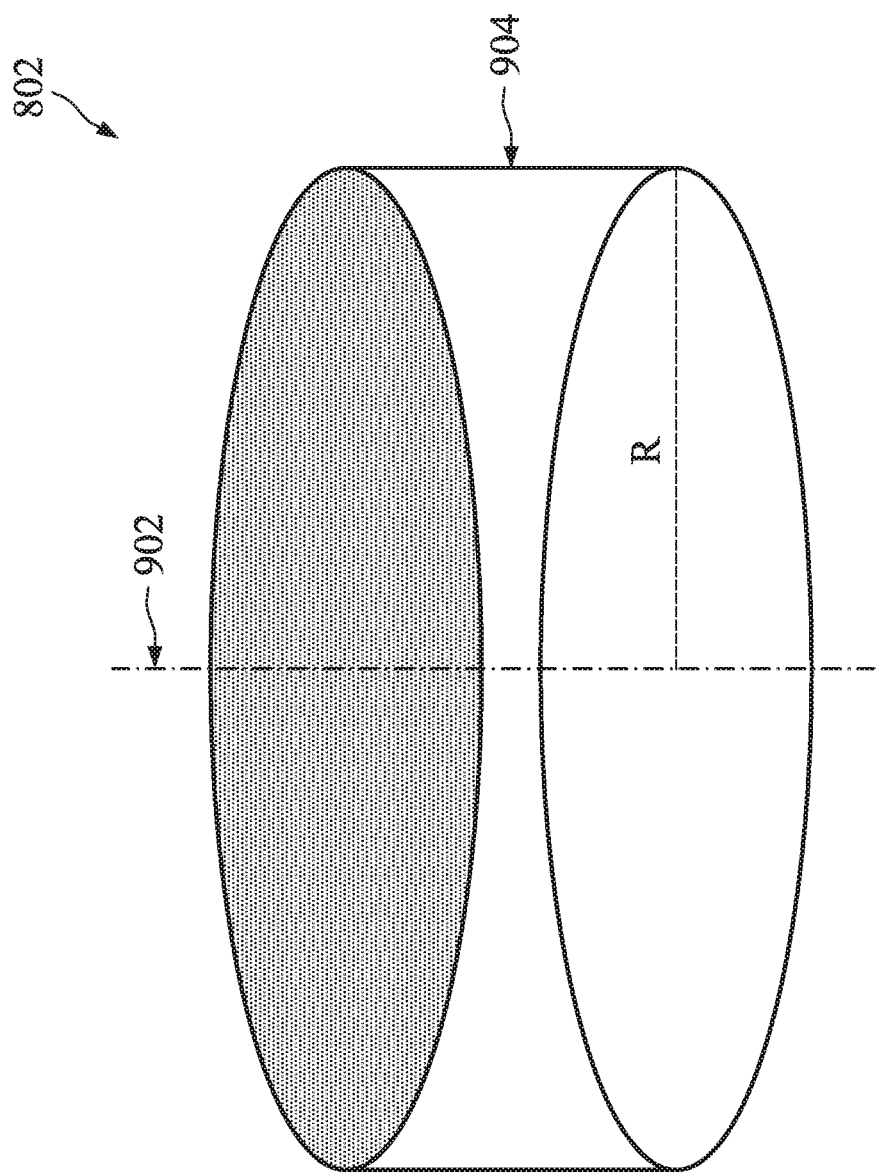
FIG. 9 is a schematic view of a blocker used in the coating apparatus of FIG. 8, constructed in accordance with some embodiments.

In some embodiment, a selective coating mechanism includes utilizing a blocker 702 having a special design, as illustrated in FIG. 7 in a top view. The blocker 702 is designed with a shape, a size and a configuration to prevent the circuit region 202 of the wafer 200 from being coated by the protecting chemical solution. For example, the blocker 702 includes a round shape with the size matching to and covering the circuit region 202 of the wafer 200. In some examples, a blocker 802 for this purpose may have a different shape to effectively prevent the circuit region 202 of the wafer 200 from being coated by the protecting chemical solution, as illustrated in FIG. 8 as a sectional view. FIG. 9 is a schematic view of the blocker 802. The blocker 802 includes a round plate 902 and curtain edge 904 connected together. During the selective coating process, the blocker 802 is positioned such that the circuit region 202 of the wafer is substantially covered from top and side so that the protecting chemical solution cannot be dispensed to the circuit region 202. Specifically, the round plate 902 has a radius equal to or close to the radius R of the circuit region 202 of the wafer 200.

Figure 3B:
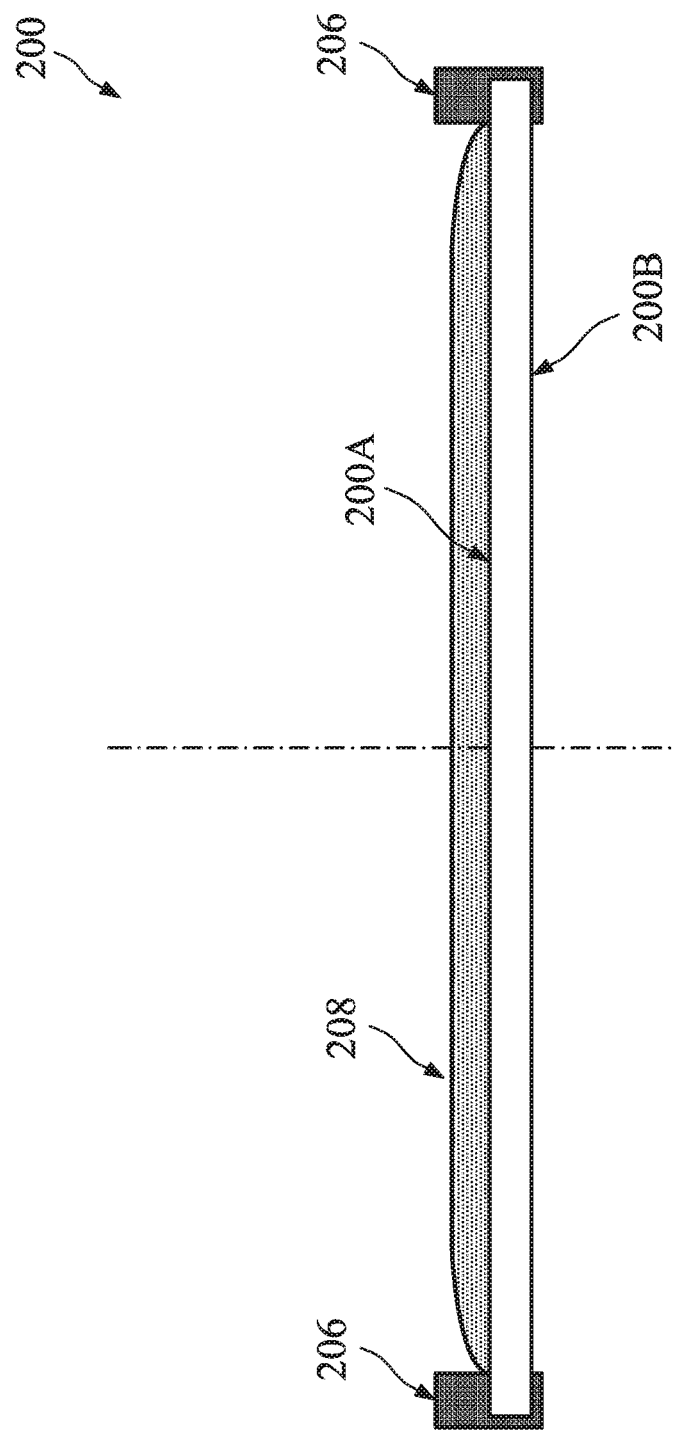

Referring back to FIG. 1, after the formation of the protecting layer 206 on the edge portion 204 of the wafer 200 by the operation 102, the method 100 proceeds to an operation 104 to coat a resist layer 208 on the wafer 200, as illustrated in FIG. 3A. Specifically, the resist layer 208 is coated on the front surface 200A of the wafer 200 in the circuit region 202 while the resist layer 208 is constrained from the edge portion 204. Alternatively, due to the surface tension, composition differences among the wafer, the protecting layer and the resist material, the edge of the resist layer 208 may have a different geometry, such as rounded edge, as illustrated in FIG. 3B. In other examples, the resist layer 208 may spread to the edge portion 204 but substantially disposed on the protecting layer 206, as illustrated in FIG. 3C.

The resist layer 208 is sensitive to radiation used in a lithography exposure process and has a resistance to etch (or implantation). In an embodiment, the resist layer 208 is formed by spin-on coating process. In some embodiments, the resist layer 208 is further treated with a soft baking process. In some embodiments, the resist layer 208 is sensitive to a radiation, such as I-line light, a deep ultraviolet (DUV) light (e.g., 248 nm radiation by krypton fluoride (KrF) excimer laser or 193 nm radiation by argon fluoride (ArF) excimer laser), an extreme ultraviolet (EUV) light (e.g., 135 nm light), an electron beam (e-beam), and an ion beam. In some examples, the resist layer 208 is soluble in a positive tone developer after being exposed by the radiation.

The resist layer 208 may include a photosensitive chemical, a polymeric material and a solvent. In some embodiments, the resist layer 208 utilizes a chemical amplification (CA) resist material. For example, the CA resist material is positive tone and includes a polymer material that turns soluble to a developer after the polymeric material is reacted with acid. In another example, the CA resist material is negative tone and includes a polymer material that turns insoluble to a developer such as a base solution after the polymer is reacted with acid. In yet another example, the CA resist material includes a polymer material that changes its polarity after the polymer is reacted with acid so that either exposed portions or unexposed portions will be removed during a developing process, depending on the type of developer (organic solvent or aqueous solvent). In one example, the CA resist includes photo-acid generator (PAG) as the photosensitive chemical and may include other sensitive chemical, such as sensitizer as used in EUV CA resist material. The polymer material in a CA resist material may further include an acid-labile group. As noted above, the protecting layer 206 is a cross-linked polymer so that it will not be dissolved during the resist coating.

Figure 10:
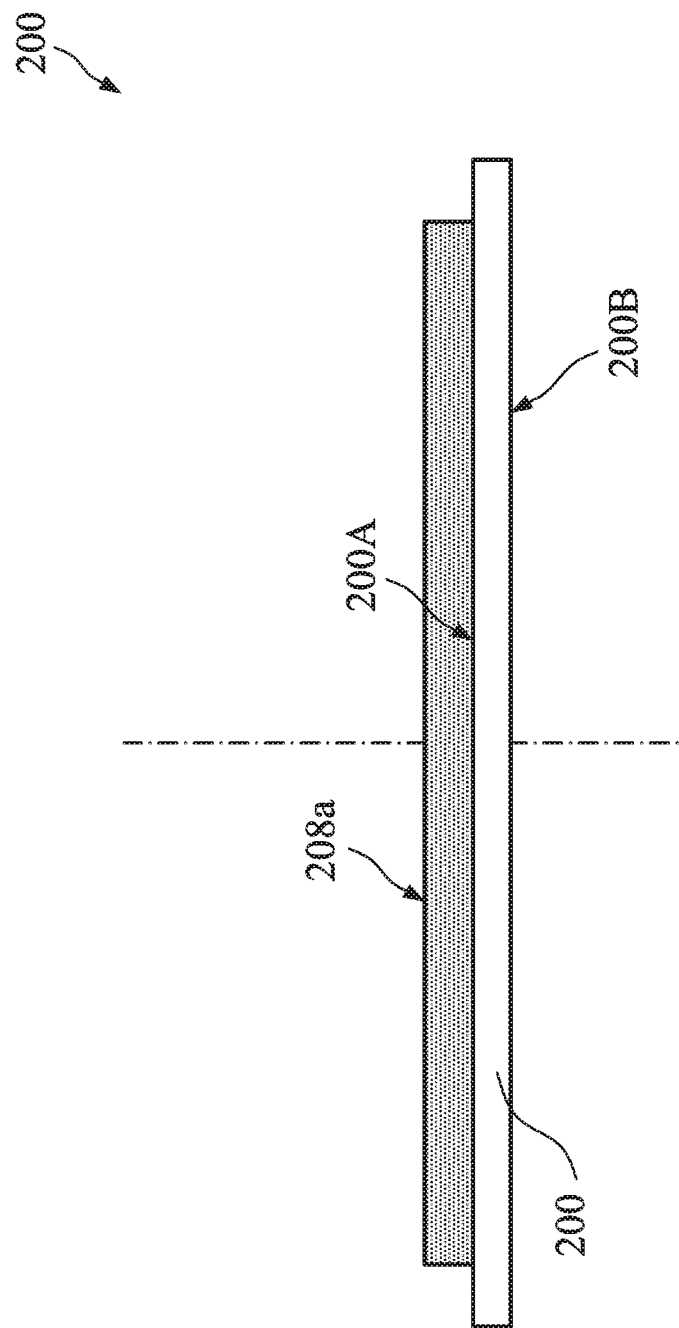
FIGS. 10, 11, 12, 13 and 14 are sectional views of the wafer at a fabrication stage, constructed in accordance with various embodiments.

Referring to FIGS. 1 and 10, the method 100 proceeds to operation 106 by removing the protecting layer 206 from the wafer by the particular removing solution that selectively removes the protecting layer 206, such as the removing solution OK73 in the present example. Thus, the edge portion 204 of the wafer 200 is free of the resist layer 208. Furthermore, since the removing solution is designed to selectively remove the protecting layer 206, the resist layer 208 remains after the removal of the protecting layer 206. The protecting layer 206 is removed prior to applying an exposure process to the resist layer since the protecting layer 206 may introduce contaminations to the lithography system (used to perform the exposure process) and to the following wafers to be exposed in the lithography system.

In the method 100, various operations, such as spin-coating, baking, removing of the protecting layer and developing are implemented in a cluster tool referred to as track (or clean track). The track includes multiple stages designed to secure a wafer for chemical processing or thermal processing, referred to as chemical stages and thermal stages, respectively. Each chemical stage is operable to spin the secured wafer and to dispense a chemical to the wafer by a spray tip while the wafer is spinning. Chemical stages can be used for spin-coating, developing, cleaning, and removing (such as resist stripping). A thermal stage is designed to secure a wafer and to heat the secured wafer, functioning as a hot plate. Thermal stages can be used for various baking, such as post-exposure baking. A wafer may be transferred to different stages in the track for various chemical and thermal processing. In the present embodiment of the method 100, the operations 104 and 106 are implemented on a same chemical stage (referred to as a first chemical stage in the following description) of the track to increase the efficiency. Particularly, when the wafer is transferred to the first chemical stage, a first spray tip (or nozzle or spray head) is positioned to dispense a first chemical (that is the solution of resist material) to the wafer 200 secured on the first chemical stage for resist coating, and thereafter a second spray tip is positioned to dispense a second chemical (that is the removing solution. More specifically, OK73 in the present embodiment) to the wafer 200 remaining on the first chemical stage for removing the first protecting layer 206.

Figure 11:
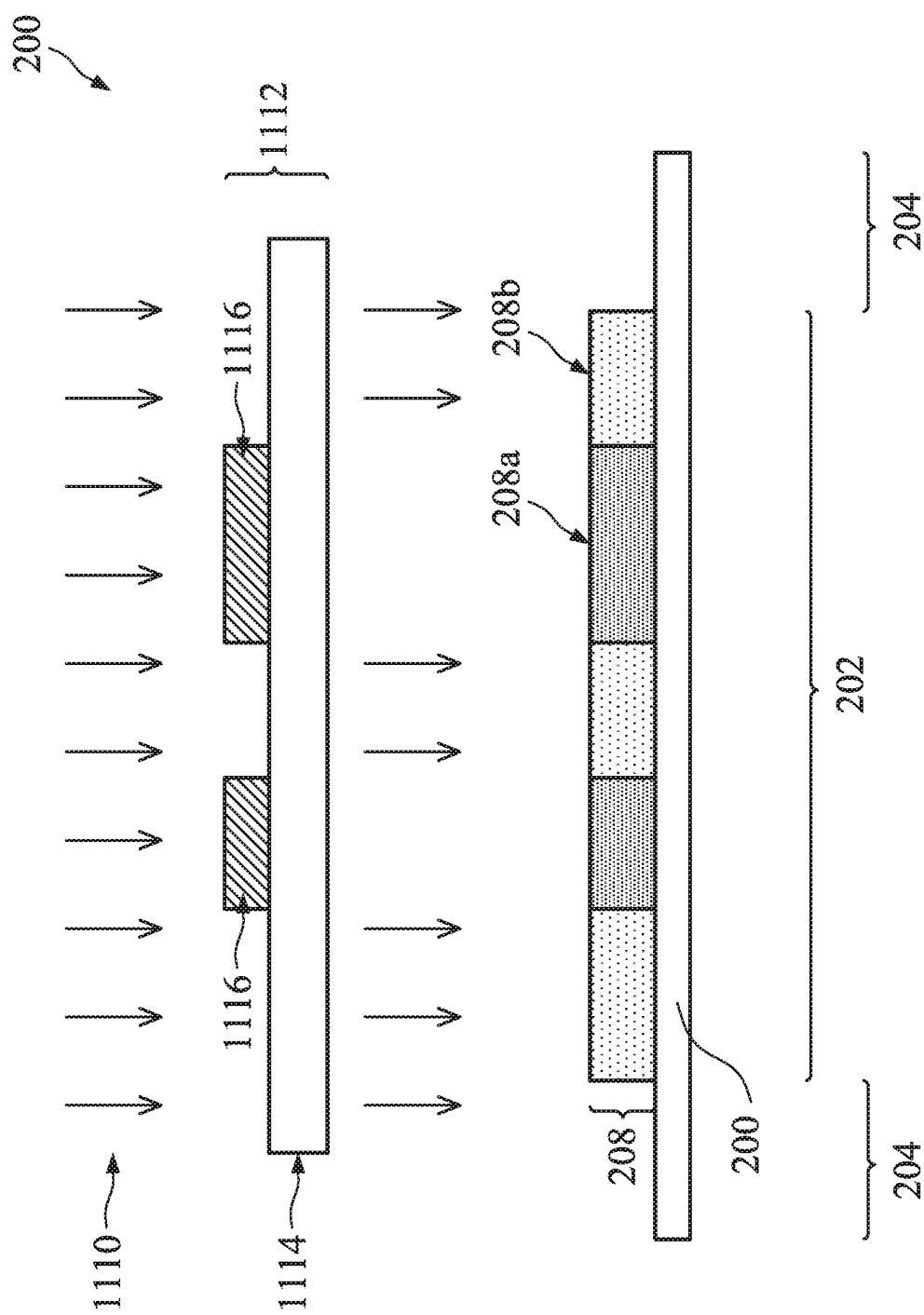

Referring to FIGS. 1 and 11 the method 100 proceeds to operation 108 by performing an exposure process to the resist layer 208 to a radiation 1110 in a lithography system. As noted, the radiation 1110 may be an I-line, a DUV radiation, a EUV radiation, or other suitable radiations. The operation 108 may be performed in air, in a liquid (immersion lithography), or in a vacuum (e.g., for EUV lithography and e-beam lithography). In some embodiments, the radiation beam 1110 is patterned with a mask 1112, such as a transmissive mask or a reflective mask, which may include resolution enhancement techniques such as phase-shifting, off-axis illumination (OAI) and/or optical proximity correction (OPC). In some other embodiments, the radiation beam is directly modulated with a predefined pattern, such as an IC layout, without using a mask (such as using a digital pattern generator or direct-write mode). In the illustrative embodiment, the radiation beam is directed to a transmissive mask 1112 that includes a transparent substrate (such as fused quartz) 1114, a patterned opaque layer (such as chromium) 1116.

After the operation 108, a latent pattern is formed on the resist layer 208. The latent pattern of a resist layer refers to the exposed pattern on the resist layer, which eventually becomes a physical resist pattern, such as by a developing process. The latent pattern of the resist layer 208 includes unexposed portions 208a and exposed portions 208b. In the present example using a CA resist material with PAG, acids are generated in the exposed portions 208b during the exposure process. In the latent pattern, the exposed portions 208b of the resist layer 208 are physically or chemically changed. In some examples, the exposed portions 208b are de-protected, inducing polarity change for dual-tone imaging (developing). In other examples, the exposed portions 208b are changed in polymerization, such as depolymerized as in positive resist or cross-linked as in negative resist.

Figure 12:
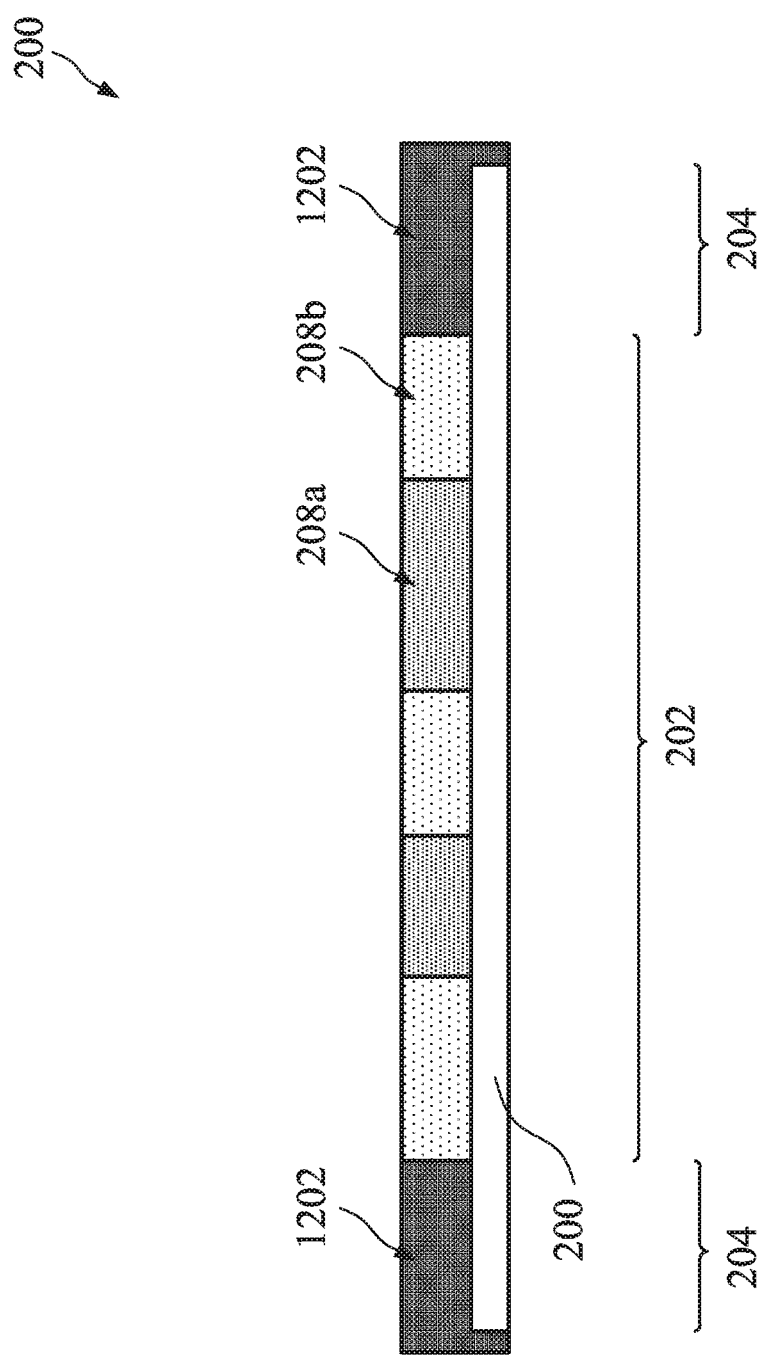

Referring to FIGS. 1 and 12, the method 100 then proceeds to operation 110 by coating a second protecting layer 1202 on the edge portion 204 of the wafer 200 after the exposure process at the operation 108 and before the following operations, such as post-exposure baking and developing. Thus, the edge portion 204 of the wafer 200 is protected from any contaminations during those operations. The second protecting layer 1202 is substantially similar to the first protecting layer 206 in terms of composition and formation. For example, the chemical solution is first coated on the edge portion 204 of the wafer 200 by spin-coating and is then cured to form a polymer material as the second protecting layer 1202. The chemical solution includes a chemical mixture of an ALG, a solubility control unit and a TAG. The chemical solution further includes proper solvent, such as organic solvent or aqueous solvent. A thermal process with a proper baking temperature will trig the TAG to release acid; the generated acid further reacts with the ALG; which leads to form the polymer material.

Referring to FIG. 1, the method 100 then proceeds to operation 112 by performing a post-exposure baking (PEB) process to the wafer 200, especially to the resist layer 208 coated on the wafer 200. During the PEB process, more acids are generated and the exposed portions of the resist material 208 are changed chemically (such as more hydrophilic or more hydrophobic). In a specific embodiment, the PEB process may be performed in a thermal chamber at temperature ranging between 90° C. and 130° C. The PEB process may have duration of about 60 seconds.

Figure 13:
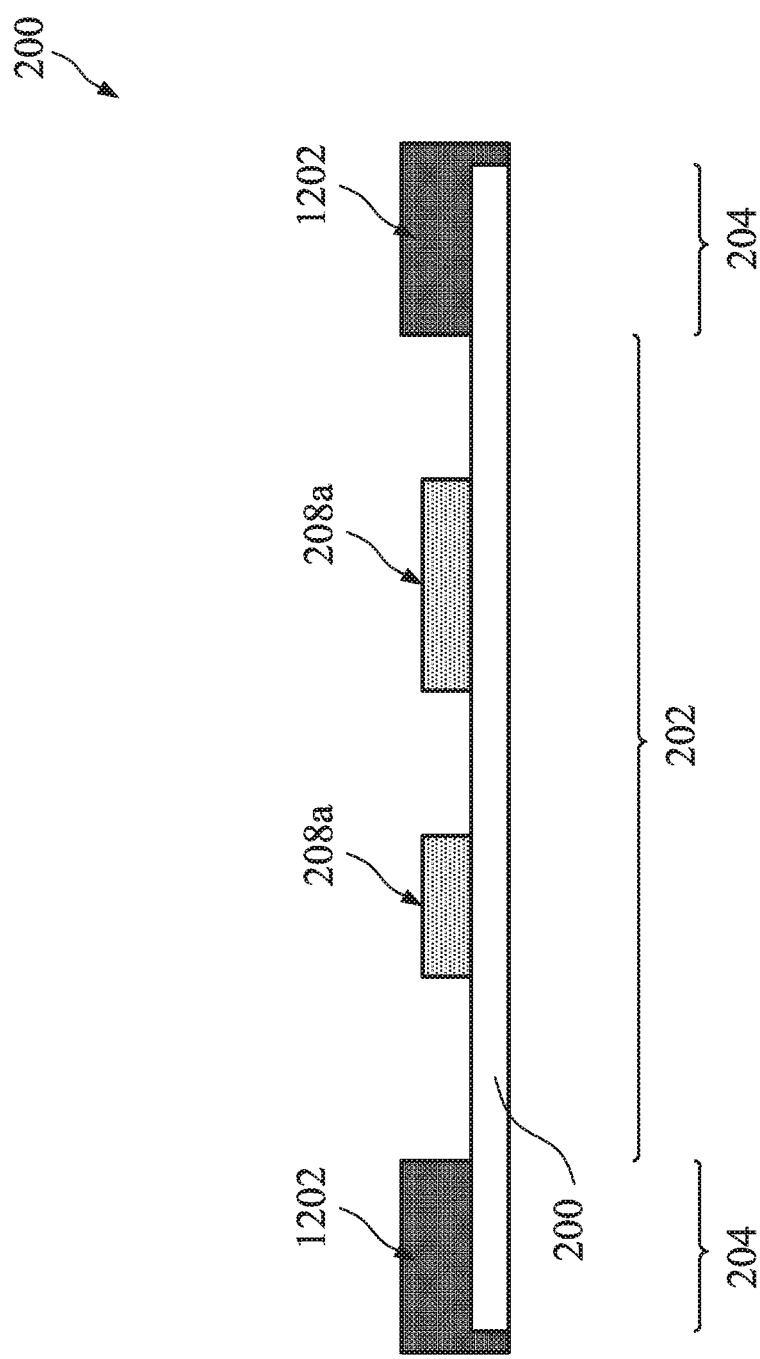

Referring to FIGS. 1 and 13, the method 100 then proceeds to operation 114 by developing the exposed resist layer 208 in a developer, constructed in accordance with some embodiments. By the developing process, a patterned resist layer is formed. In some embodiments, the resist layer 208 experiences a polarity change after the operation 106, and a dual-tone developing process may be implemented. In some examples, the resist layer 208 is changed from a nonpolar state (hydrophobic state) to a polar state (hydrophilic state), then the exposed portions 208b will be removed by an aqueous solvent (positive tone imaging), such as tetramethyl ammonium hydroxide (TMAH), or alternatively the unexposed portions 208a will be removed by an organic solvent (negative tone imaging), such as butyl acetate. In some other examples, the resist layer 208 is changed from a polar state to a nonpolar state, then the exposed portions 208b will be removed by an organic solvent (positive tone imaging) or the unexposed portions 208a will be removed by an aqueous solvent (negative tone imaging).

In the present example illustrated in FIG. 13, the exposed portions 208b are removed in the developing process. Further in this example in FIG. 13, the patterned resist layer is represented by a two-line pattern. However, the following discussion is equally applicable to resist patterns represented by trenches.

Figure 14:
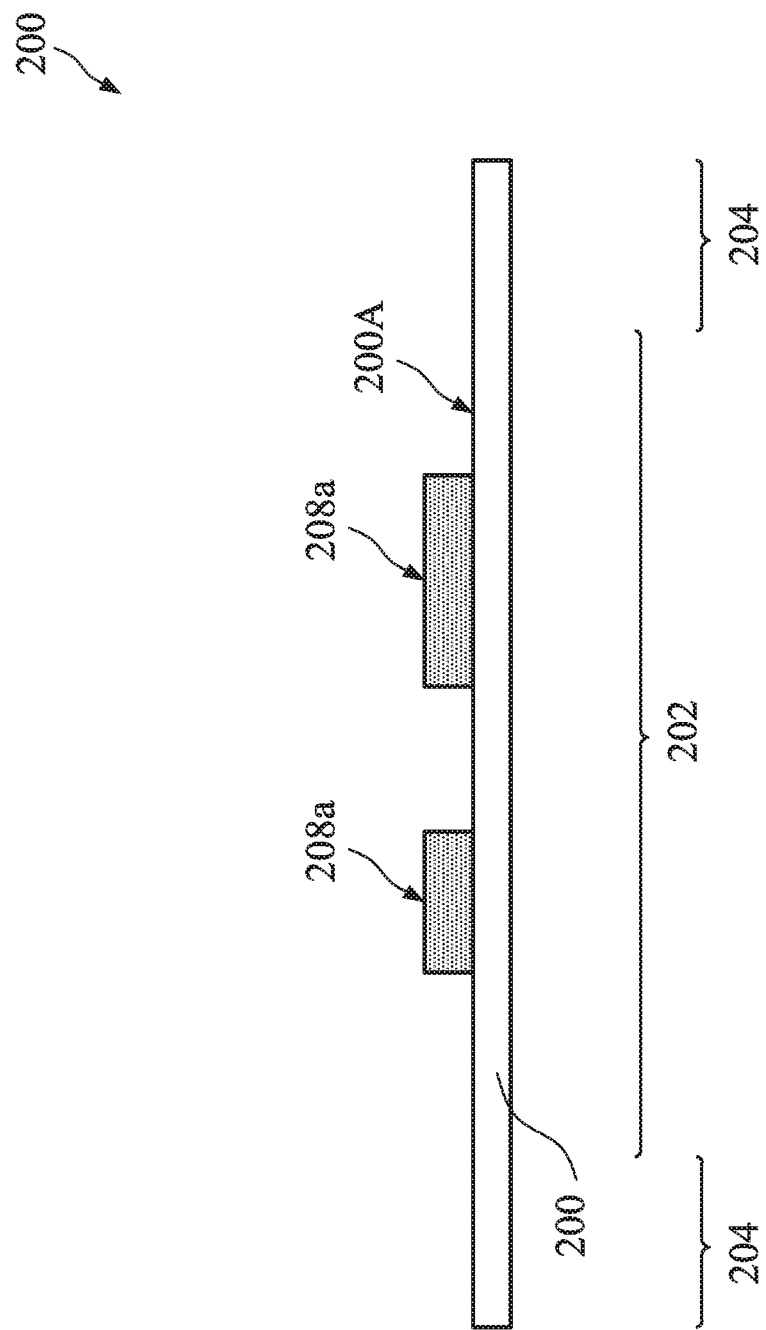

Referring to FIGS. 1 and 14, the method 100 then proceeds to operation 116 by removing the second protecting layer 1201 from the wafer by a particular removing solution, such as in the present example. The operation 116 is substantially similar to the operation 106. For example, the removing solution is designed to selectively remove the second protecting layer 1202 (that is the same to the first protecting layer 206 in composition), the resist layer 208 remains after the removal of the second protecting layer 1202. The second protecting layer 1202 is removed after the developing process at the operation 114. Particularly, the operations 114 and 116 are implemented sequentially on the same chemical stage (referred to as a second chemical stage) of the track for efficiency and manufacturing throughput. When the wafer 200 is transferred to the second chemical stage, a first spray tip is positioned to dispense a first chemical (that is the developer) to the wafer 200 secured on the second chemical stage for developing, and thereafter a second spray tip is positioned to dispense a second chemical (that is the removing solution. More specifically, OK73 in the present embodiment) to the wafer 200 remaining on the second chemical stage for removing the second protecting layer 1202.

Still referring to FIGS. 1 and 15, the method 100 includes an operation 118 by performing a fabrication process to the wafer 200 using the patterned resist layer as a mask such that the fabrication process is only applied to the portions of the wafer 200 within the openings of the patterned resist layer while other portions covered by the patterned resist layer are protected from being impacted by the fabrication process. In some embodiments, the fabrication process includes an etching process applied to wafer 200 (a top material layer on the wafer) using the patterned resist layer as an etch mask, thereby transferring the pattern from the patterned resist layer to the wafer (or the top material layer on the wafer). In alternative embodiments, the fabrication process includes an ion implantation process applied to the wafer 200 using the patterned resist layer as an implantation mask, thereby forming various doped features in the wafer 200.

In some example, the top material layer is a hard mask layer. To further this embodiment, the pattern is first transferred from the patterned resist layer to the hard mask layer, then to other layers of the wafer 200. For example, the hard mask layer may be etched through openings of the patterned resist layer using a dry (plasma) etching, a wet etching, and/or other etching methods. For example, a dry etching process may implement an oxygen-containing gas, a fluorine-containing gas, a chlorine-containing gas, a bromine-containing gas, an iodine-containing gas, other suitable gases and/or plasmas, and/or combinations thereof. The patterned resist layer may be partially or completely consumed during the etching of the hard mask layer. In an embodiment, any remaining portion of the patterned resist layer may be stripped off, leaving a patterned hard mask layer over the wafer.

Although not shown in FIG. 1, the method 100 may include other operations before, during or after the operations described above. In an embodiment, the wafer 200 is a semiconductor substrate and the method 100 proceeds to forming fin field effect transistor (FinFET) structures. In this embodiment, the method 100 includes forming a plurality of active fins in the semiconductor substrate of the wafer. In furtherance of the embodiment, the operation 110 further includes etching the substrate through the openings of the patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In another embodiment, the method 100 includes other operations to form a plurality of gate electrodes on the semiconductor substrate of the wafer 200. The method 100 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate, which has been etched by operation 118 to form a plurality of trenches. The method 100 proceeds to filling the trenches with a conductive material, such as a metal; and polishing the conductive material using a process such as chemical mechanical planarization (CMP) to expose the patterned ILD layer, thereby forming the metal lines in the ILD layer. The above are non-limiting examples of devices/structures that can be made and/or improved using the method 100 according to various aspects of the present disclosure.

As described above, the semiconductor wafer 200 may be an intermediate structure fabricated during processing of an IC, or a portion thereof, that may include logic circuits, memory structures, passive components (such as resistors, capacitors, and inductors), and active components such as diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The present disclosure provides a method for lithography process. The disclosed method includes coating the wafer edge such that the resist material is constrained to be coated on the front surface of the wafer within the circuit region so that the wafer edge is either free of resist material during a lithography patterning method including or not directly coated on by resist. Thus, the wafer is protected by the (first/second) protecting layer to eliminate various concerns, including metal contaminations, during the lithography process. Especially, the protecting layer is further avoided when the wafer is transferred to the lithography system for the exposure process to avoid contaminations to the lithography system from the first protecting layer itself.

The embodiments of the present disclosure offer advantages over existing art, though it is understood that other embodiments may offer different advantages, not all advantages are necessarily discussed herein, and that no particular advantage is required for all embodiments. By utilizing the disclosed method, the accumulation of the resist material on wafer edge and associated issues (such as contamination and resist peeling) are eliminated. In other examples, the disclosed method to form a protected wafer edge is easy to implement, therefore the manufacturing cost is reduced, and the manufacturing throughput is increased. Furthermore, there is no additional contamination introduced by the wafer edge modification. In other examples, the various operations (such as operations 104 and 105 or operations 114 and 116) are collectively implemented on a same wafer stage of the track to increase the processing efficiency and manufacturing cost.

Thus, the present disclosure provides a semiconductor fabrication method. The method includes coating an edge portion of a wafer by a first chemical solution including a chemical mixture of an acid-labile group, a solubility control unit and a thermal acid generator; curing the first chemical solution to form a first protecting layer on the edge portion of the wafer; coating a resist layer on a front surface of the wafer; removing the first protecting layer by a first removing solution; and performing an exposure process to the resist layer.

The present disclosure provides another embodiment of a method for lithography patterning. The method includes coating an edge portion of a front surface of a wafer by a first protecting layer of a polymeric material; coating a resist layer on the front surface of the wafer; removing the first protecting layer; performing an exposure process to the resist layer; coating the edge portion of the front surface of the wafer by a second protecting layer of the polymeric material; performing a post-exposure baking process to the resist layer; performing a developing process to the resist layer to form a patterned resist layer; and removing the second protecting layer.

The present disclosure provides another embodiment of a method for lithography patterning. The method includes coating an edge portion of a wafer by a first chemical solution including a chemical mixture of an acid-labile group, a solubility control unit and a thermal acid generator; curing the first chemical solution to form a first protecting layer on the edge portion of the wafer; coating a resist layer on a front surface of the wafer; removing the first protecting layer by a removing solution that includes propylene glycol methyl ether (PGME) and propylene glycol methyl ether acetate (PGMEA); and thereafter, performing an exposure process to the resist layer.

The present disclosure provides another embodiment of a method for lithography patterning. The method includes coating an edge portion of a wafer by a first chemical solution including a chemical mixture of an acid-labile group, a solubility control unit and a thermal acid generator; curing the first chemical solution to form a first protecting layer on the edge portion of the wafer; coating a resist layer on a front surface of the wafer; removing the first protecting layer by a removing solution that includes propylene glycol methyl ether (PGME) and propylene glycol methyl ether acetate (PGMEA); and thereafter, performing an exposure process to the resist layer, wherein the solubility control unit is chosen from lactone, ester, ether, ketone and a combination thereof.

The present disclosure provides another embodiment of a method for lithography patterning. The method includes coating an edge portion of a front surface of a wafer by a first protecting layer of a polymeric material; coating a resist layer on the front surface of the wafer; removing the first protecting layer by a removing solution that includes propylene glycol methyl ether (PGME) and propylene glycol methyl ether acetate (PGMEA); thereafter, performing an exposure process to the resist layer; coating the edge portion of the front surface of the wafer by a second protecting layer of the polymeric material; performing a post-exposure baking process to the resist layer; thereafter, performing a developing process to the resist layer to form a patterned resist layer; and removing the second protecting layer by the removing solution that includes PGME and PGMEA.

The present disclosure provides another embodiment of a method for lithography patterning. The method includes coating an edge portion of a front surface of a wafer by a first chemical solution including a chemical mixture of an acid-labile group, a solubility control unit and a thermal acid generator; curing the first chemical solution to form a first protecting layer on the edge portion of the wafer; coating a resist layer on the front surface of the wafer; thereafter, removing the first protecting layer by a removing solution that includes propylene glycol methyl ether (PGME) and propylene glycol methyl ether acetate (PGMEA); performing an exposure process to the resist layer; coating the edge portion of the front surface of the wafer by a second chemical solution including the chemical mixture; curing the second chemical solution to form a second protecting layer on the edge portion of the wafer; performing a post-exposure baking process to the resist layer; performing a developing process to the resist layer to form a patterned resist layer; and removing the second protecting layer the removing solution.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    coating a resist layer on a front surface of a wafer;
    performing an exposure process to the resist layer to form an exposed portion of the resist layer and an unexposed portion of the resist layer;
    after the exposure process is performed, forming a first protecting layer on an edge portion of the front surface of the wafer;
    with the first protecting layer on the wafer, developing the resist layer to selectively remove one of the exposed portion and the unexposed portion; and
    after the developing, removing the first protecting layer.

2. The method of claim 1, wherein the forming of the first protecting layer includes coating the edge portion of the front surface of the wafer by a first chemical solution; and curing the first chemical solution to form the first protecting layer on the edge portion of the front surface of the wafer.

3. The method of claim 2, wherein the first chemical solution includes a chemical mixture of an acid-labile group, a solubility control unit and a thermal acid generator.

4. The method of claim 3, wherein
    the acid-labile group includes a t-butoxycardbonyl (tBOC); and
    the thermal acid generator is chosen from $NH_4^+C_4F_9SO_3^-$ and $NH_4^+CF_3SO_3^-$.

5. The method of claim 3, wherein the solubility control unit is chosen from lactone, ester, ether, ketone and a combination thereof.

6. The method of claim 3, wherein
    the coating of the edge portion of the front surface of the wafer includes spray-coating the first chemical solution to the edge portion of the front surface of the wafer; and
    the curing of the first chemical solution includes performing a first baking process to the first chemical solution with a baking temperature that can trigger the thermal acid generator to release acid.

7. The method of claim 6, wherein the spray-coating of the first chemical solution includes
    delivering the first chemical solution to the edge portion of the front surface of the wafer using a spray head configured to aim at the edge portion; and
    simultaneously spinning the wafer during the delivering of the first chemical solution.

8. The method of claim 3, further comprising
    coating the edge portion of the front surface of the wafer with a second chemical solution including the chemical mixture, before the coating of the resist layer on the front surface of the wafer; and
    curing the second chemical solution to form a second protecting layer on the edge portion of the front surface of the wafer.

9. The method of claim 8, further comprising:
    removing the second protecting layer by a removing solution after the coating of the resist layer on the front surface of the wafer and before the performing of the exposure process;
    before the developing of the resist layer, performing a post-exposure baking process; and
    thereafter, removing the first protecting layer by the removing solution.

10. The method of claim 9, wherein the removing solution includes propylene glycol methyl ether (PGME) and propylene glycol methyl ether acetate (PGMEA).

11. A method, comprising:
    forming a first protecting layer around an edge portion of a wafer;
    coating a resist layer on the wafer absent from the first protecting layer;
    removing the first protecting layer;
    after the first protecting layer is removed, exposing the resist layer to a radiation;
    after the exposing of the resist layer, forming a second protecting layer around the edge portion of the wafer; and
    with the second protecting layer on the wafer, performing a post-exposure baking process to the resist layer.

12. The method of claim 11, wherein
    the forming of the first protecting layer includes forming the first protecting layer of a polymeric material; and the forming of the second protecting layer includes forming the second protecting layer of the polymeric material.

13. The method of claim 12, wherein the forming of the first protecting layer includes
coating the edge portion of the wafer by a chemical solution; and
curing the chemical solution to form the first protecting layer on the edge portion of the wafer.

14. The method of claim 13, wherein the coating of the edge portion of the wafer by the chemical solution includes
spray-coating the chemical solution to the edge portion of the wafer; and
curing the chemical solution by an ultraviolet radiation to form the first protecting layer.

15. The method of claim 14, wherein the chemical solution includes a chemical mixture of an acid-labile group, a solubility control unit and a thermal acid generator.

16. The method of claim 15, wherein
the acid-labile group includes a t-butoxycardbonyl (tBOC);
the thermal acid generator is chosen from $NH_4^+C_4F_9SO_3^-$ and $NH_4^+CF_3SO_3^-$; and
the solubility control unit is chosen from lactone, ester, ether, ketone and a combination thereof.

17. The method of claim 11, further comprising:
after the post-exposure baking process is performed, performing a developing process to the resist layer to form a patterned resist layer; and
removing the second protecting layer.

18. The method of claim 17, wherein
the removing of the first protecting layer includes removing the first protecting layer using a removing solution that includes propylene glycol methyl ether (PGME) and propylene glycol methyl ether acetate (PGMEA); and
the removing of the second protecting layer includes removing the second protecting layer using the removing solution.

19. A method, comprising:
coating a resist layer on a front surface of a wafer, the resist layer being absent from an edge portion;
performing an exposure process to the resist layer;
forming a protecting layer on the edge portion of the wafer, after the performing of the exposure process to the resist layer;
with the protecting layer on the edge portion of the wafer, performing a developing process to the resist layer to form a patterned resist layer; and
after the developing process, removing the protecting layer.

20. The method of claim 19, wherein the forming of the protecting layer includes
coating a chemical solution to the edge portion of the wafer, the chemical solution including a chemical mixture of an acid-labile group, a solubility control unit and a thermal acid generator; and
curing the chemical solution to form the protecting layer.

* * * * *